United States Patent
Barcley

(10) Patent No.: US 6,671,176 B1
(45) Date of Patent: Dec. 30, 2003

(54) METHOD OF COOLING HEAT-GENERATING ELECTRICAL COMPONENTS

(75) Inventor: Tina P. Barcley, Mendon, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/184,357

(22) Filed: Jun. 27, 2002

(51) Int. Cl.⁷ .................................................. H05K 7/20
(52) U.S. Cl. .................... 361/719; 361/704; 361/722; 361/760; 174/16.3; 257/706; 257/707; 165/80.3; 165/185
(58) Field of Search .................................. 361/690, 702, 361/703, 704, 719, 760, 767, 807; 257/706, 707, 712, 718; 165/80.3, 185; 174/16.3, 252

(56) References Cited

U.S. PATENT DOCUMENTS

| | | | |
|---|---|---|---|
| 4,954,878 A | | 9/1990 | Fox et al. |
| 5,065,227 A | | 11/1991 | Frankeny et al. |
| 5,339,519 A | * | 8/1994 | Fortune ........................ 29/840 |
| 5,708,566 A | * | 1/1998 | Hunninghaus et al. ...... 361/704 |
| 5,870,286 A | | 2/1999 | Butterbaugh et al. |
| 5,930,117 A | * | 7/1999 | Gengel ........................ 361/720 |
| 6,201,701 B1 | * | 3/2001 | Linden et al. .............. 361/720 |
| 6,212,071 B1 | * | 4/2001 | Roessler et al. ............ 361/704 |
| 6,226,183 B1 | * | 5/2001 | Weber et al. ................ 361/704 |
| 6,288,906 B1 | * | 9/2001 | Sprietsma et al. .......... 361/772 |
| 6,349,033 B1 | * | 2/2002 | Dubin et al. ................ 361/704 |
| 6,373,348 B1 | * | 4/2002 | Hagerup ................... 333/81 A |

* cited by examiner

Primary Examiner—Boris Chervinsky
(74) Attorney, Agent, or Firm—Clyde E. Bailey, Sr.

(57) ABSTRACT

A method of cooling heat-generating electrical components during service has a heat-removing element. Heat-removing element comprises a plurality of vias therein and is fixedly attached to a tip of the electrical components, typically on opposed charged ends. Heat absorbed by the heat-removing element is then transported to a heat sink, cooperatively associated therewith, for disposal. In an electrical assemblage, a circuit board contains multiple heat generating components each being associated with a heat-removing element of the invention.

7 Claims, 2 Drawing Sheets

METHOD OF COOLING HEAT-GENERATING ELECTRICAL COMPONENTS

CROSS-REFERENCE TO RELATED APPLICATIONS

The present application is related to U.S. application Ser. No. 10/184,346, filed Jun. 27, 2002, by Tina P. Barcley, and entitled, "Insitu-Cooled Electrical Assemblage And Method Of Manufacturing Same;" and U.S. application Ser. No. 10/184,290, filed Jun. 27, 2002, by Tina P. Barcley, and entitled, "Cooling-Assisted, Heat-Generating Electrical Component And Method Of Manufacturing Same."

FIELD OF THE INVENTION

The invention relates to improvements in heat transfer in electronic technology. More particularly, the invention concerns electrical assemblages, such as circuit boards, which reduce heat generated in ceramic "chip" components during service.

BACKGROUND OF THE INVENTION

It is well known that overheating of electrical components, for instance components mounted on a circuit board, contributes to reducing the life of the component. Overall component reliability is also compromised by excessive overheating during service. As circuit boards become denser and contain components that have higher power output capacity, reliability problems become magnified for solder joints of the circuit board, particularly in "chip" ceramic type parts due to CTE (Coefficient of Thermal Expansion) differences.

The current trend in the industry is to either assume the reliability risk or to institute extremely expensive chip construction processes for removing excess heat. Both practices have proven undesirable from a cost management standpoint.

In a typical electronic package, the largest chip ceramic component, for instance the 2512 resistor, is the least reliable component on most circuit boards and the component most likely to fracture its solder joint due to thermal cycling. The thermal cycling occurs every time the component is used. It would, therefore, be desirable to cool this component during service to dramatically improve its useful life and reliability.

Therefore, a need persists in the art for a system and method of cooling electrical components, such as those mounted in circuit boards, during service that produces a component that is reliable, cost effective and has an extended useful life.

SUMMARY OF THE INVENTION

It is, therefore, an object of the present invention to provide an electrical component protected from deterioration due to overheating during service.

Another object of the invention is to provide such an electrical component that is considerably more reliable, has a longer useful life and is cost effective to build and use.

The present invention is directed to overcoming one or more of the problems set forth above. Briefly summarized, according to one aspect of the present invention, a method of cooling heat-generating components arranged on a circuit board includes the step of providing a circuit board containing at least one heat-generating component mounted thereon. The heat-generating component has a characteristic junction temperature $T_j$ to be reduced during service. Thus, means for reducing the junction temperature $T_j$ of the component is provided in the electrical assemblage. A heat-removing element, preferably comprising a plurality of thermal vias, is adapted to the heat-generating component typically on either of first and second mating surfaces. A heat sink element is also cooperatively associated with the heat removing element for transporting heat removed from the heat-generating component to the heat removing element thereby reducing the junction temperature $T_j$ of the heat-generating component to a temperature $T_1$, wherein $T_1$ is less than $T_j$.

The present invention has numerous advantages over existing developments including reliability, cost effectiveness, ease of development, and increased component useful life. Moreover, the present invention has the advantage of being applicable to practically any ceramic chip, ball grid array (BGA), direct die attached components, chip-on-board, and smaller chip resistors, such as the 2010, 1206, etc.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

Figure 1:
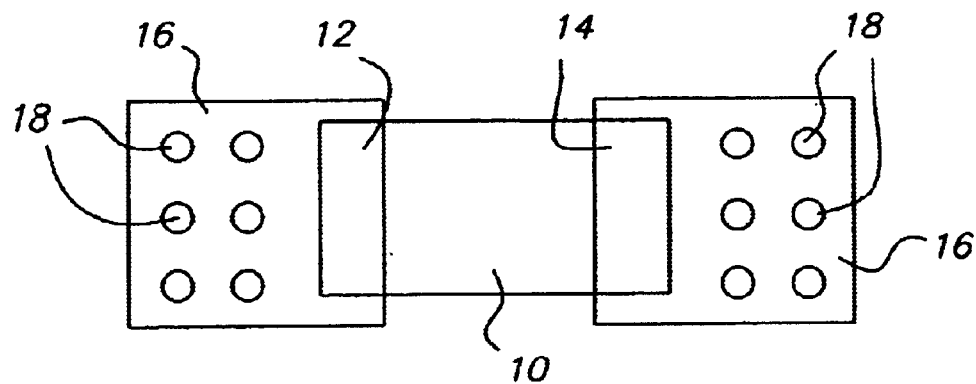
FIG. 1 is an elevated plan view of an electrical component having the heat-removing element of the invention;.
Figure 2:
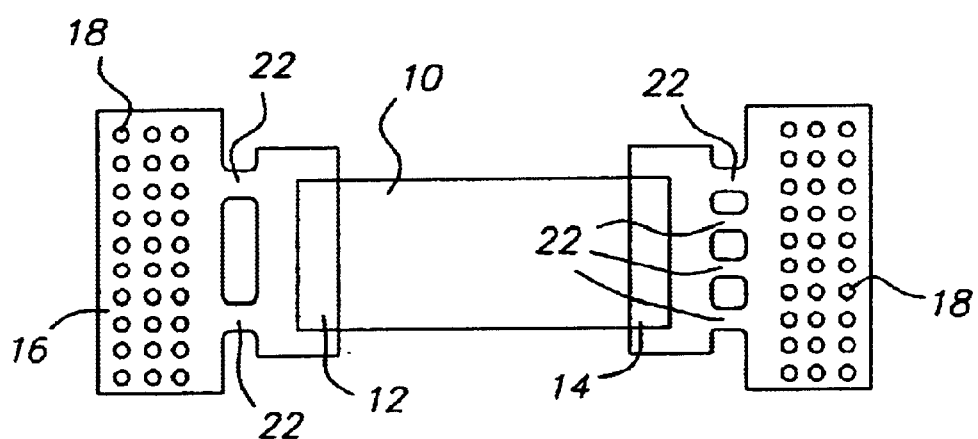
FIG. 2 is an elevated front plan view of an electrical component having alternative heat-removing elements thereon.

Turning now to the drawings, and in particular to FIGS. 1 and 2, the electrical component 10 of the invention is illustrated. According to FIG. 1, electrical component 10, for instance a resistor or capacitor, has mating portions 12, 14 and a heat-removing element 16 attached to either of mating portions 12, 14. Electrical component 10 is preferably made of a ceramic or ceramic-like material for suitability of die usage or affixing other electrical components (multi-chip module). Although soldering is the preferred method of attaching heat-removing element 16 to either of mating portions 12, 14, skilled artisans will appreciate that other methods may be used including using electrically conductive adhesives. Mating portions 12, 14 are typically gold or palladium tipped for best thermal conductivity and solderability. Skilled artisans will appreciate that, alternatively, the mating portions 12, 14 may comprise other thermally conductive materials such as tin-lead.

According to FIG. 1, heat-removing element 16 has a plurality of thermal vias 18 that provides the mechanism for effectively removing heat from the electrical component 10. The thermal conductivity of thermal vias 18 is enhanced as possible with the addition of solder or some thermal compound either partially or totally filling the inner walls (not shown) of thermal vias 18. Thermal vias 18 may have practically any size diameter. A preferred range for the diameter is about 0.022 inches to about 0.040 inches. However, a diameter in the range of about 0.022 inches to about 0.028 inches is more preferred.

Figure 3:
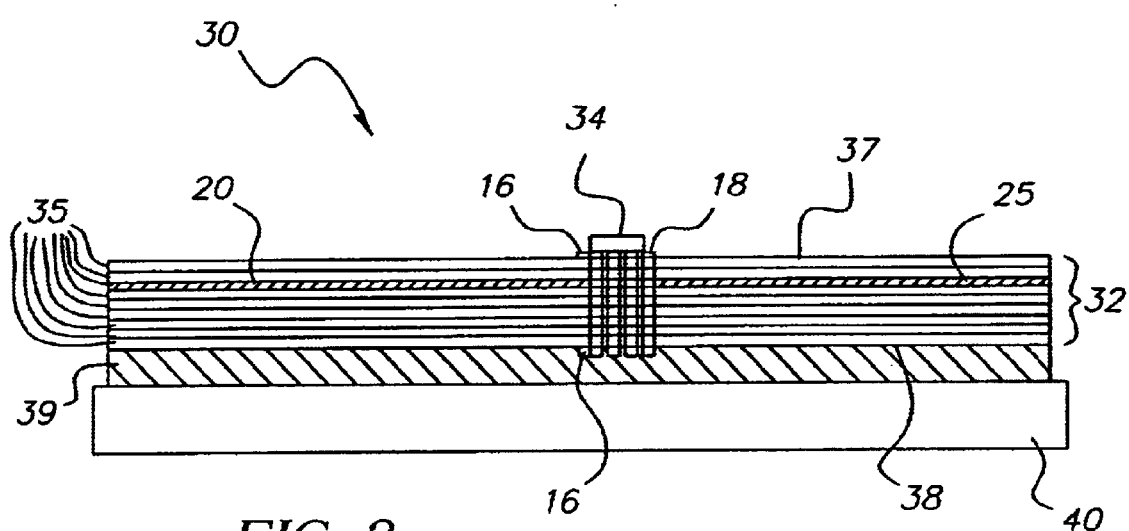
FIG. 3 is a cross-sectional view of a typical circuit board construction having the heat-removing element of the invention thereon; and, FIG. 4 is a plan view of a solder stencil used for automated manufacturing of heat-removing element and thermal vias.

As shown in FIG. 3, skilled artisans will appreciate that thermal vias 18 may be electrically connected to a high density copper plane 20 to increase the thermal conductivity of the vias 18. Therefore, practically any high density copper circuit or collection of signals 25 can be used to increase the thermal conductivity of the vias 18. The maximum effect on thermal conductivity is realized when the thermal vias 18 are connected to a large copper area, such as high-density copper plane 20. Typically, large copper areas are generally used for grounds and power circuits. This construction would also include a bonded heat sink 40, as described below. Use of a thermal conductive bonding adhesive or thermally conductive compound will effectively maximize the heat transfer to the heat sink.

Referring to FIG. 3, an electrical assemblage 30 is illustrated. According to FIG. 3, electrical assemblage 30 includes a main portion, or circuit board 32, and at least one heat-generating component 34, each with the heat-removing elements 16 of the invention. Heat-removing element 16, as described above, has a plurality of thermal vias 18 for transporting heat away from heat-generating component 34. Heat-generating component 34 has a junction temperature $T_j$. To reduce the junction temperature $T_j$ of the heat-generating component 34, the thermal vias 18 transport the heat generated by component 34 to the bottom outer layer 38 of circuit board 32. The heat is then transported from the bottom outer layer 38 to the adjoining heat sink 40. Heat sink 40 may be adjoined to bottom outer layer 38 with, for instance, a thermally conductive adhesive material. In this way, the junction temperature $T_j$ of the heat-generating component 34 is reduced to a temperature $T_1$, wherein $T_1$ is less than $T_j$.

As an example, a 10-layer polyimide circuit board 32 may comprise ½ oz. copper on the inner layers 35 and 1 oz. copper on the outer layers 37 (top), 38 (bottom). The heat-removing element 16 of the invention can be used with any material circuit board since the primary heat transfer mechanism is conduction through the thermal vias 18. Moreover, heat-removing element 16 can be used on any number of layers or copper weight available from any circuit board manufacturer. Current industry standards for circuit board plating include Pd, NiAu, Immersion Tin, Immersion Ag, and HASL for plating types. The specific board material was polyimide, but any board material where vias can be drilled could use this invention (FR2, FR4, CEM, Rogers, etc.). For the electrical assemblage 30 of the invention, a particular pattern of thermal vias 18 is used on the heat-removing element 16. The thermal vias 18 are preferably about 0.025 inches in diameter with a grid spacing of about 0.040 inches center-to-center for the hole pattern (see for instance, FIGS. 1 and 2). This hole pattern provides a specific cross-sectional area of copper in the circumference of the thermal vias 18 to conduct the heat from the top outer layer 37 of the circuit board 32 to the bottom outer layer 38. The copper of heat-removing element 16 is used to transport heat across the surface of the circuit board 32. Additionally, the similar heat-removing elements on the bottom outer layer 38 of the circuit board 32 enhance the transport of the heat from the thermal vias 18 to the heat sink 40.

Referring again to FIGS. 1 and 2, heat-removing element 16 may have practically any geometric configuration. In FIG. 1, heat-removing element 16 is substantially rectangular shaped. As shown in FIG. 2, alternatively, heat-removing element 16 may be substantially T-shaped. In this latter design the T-shaped pads are used to separate the thermal vias 18 from mating surfaces 12, 14 to improve solderability and manufacturability. Typically one would stay away from the actual solder joint (not shown), i.e., the interface of the mating surface 12, 14 and the heat-removing element 16 of the electrical component 10 in order to maintain solder joint integrity. Separation of thermal vias 18 from the mating surfaces 12, 14 may be accomplished by use of webs 22, typically comprising copper, on circuit board 32. Any number of webs 22 may be used depending on the application.

Referring to FIG. 3, electrical assemblage 30 of the invention has an aluminum heat sink 40 that is 0.090 inches thick. The heat sink 40 was attached via adhesive layer 39 to the circuit board 32 using an Arlon Thermobond® silicone, thermally conductive, electrically isolative adhesive film. Any metal heat sink 40 could have been used of any thickness, preferably between 0.060 inches and 0.090 inches. An adhesive film having a 0.007 inch glass bead incorporated therein may also be used to facilitate bonding of the heat sink element to the at least one heat removing element. Additionally, any thermally conductive compound or adhesive (including epoxies and liquid silicones) could be used with substantially similar results. Those skilled in the art will appreciate that thermally conductive, electrically conductive adhesives may be used as a substitute for thermally conductive compounds.

Figure 4:
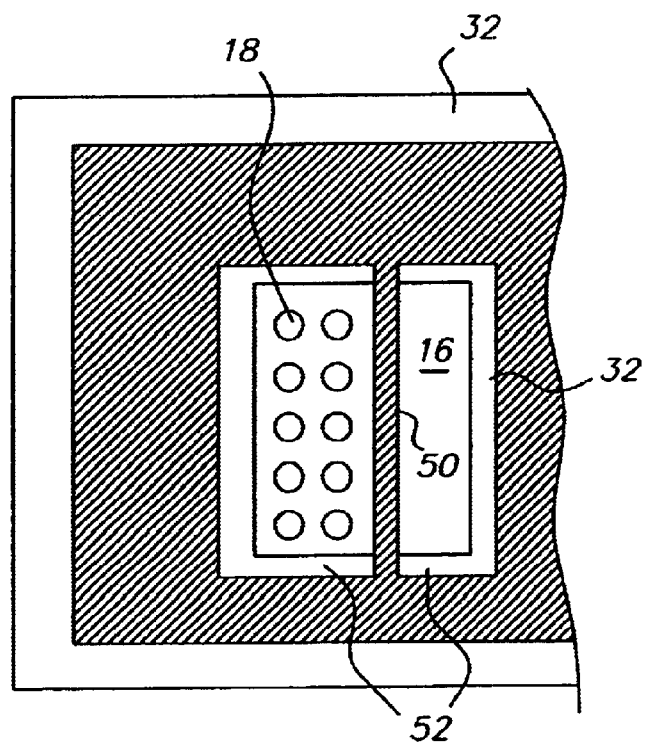

Turning now to FIG. 4, to construct electrical assemblage 30 of the invention, a solder stencil 50 may be used to automatically apply solder paste to the circuit board 32 in high volume electronic applications. Solder stencil 50 has at least one cut-out portion 52 (two are shown) which provides a path for the solder paste to be applied to the heat-removing elements 16 of circuit board 32. Although this process may be accomplished manually, solder stenciling has the advantage of consistency and ease of use. The solder stencil 50 has standard support features that reduces sagging in the vicinity of the cut-out portions 52. The amount of solder paste applied to the heat-removing elements 16 can be increased by increasing the size of the cut-out portions 52. The increased amount of solder paste associated with the increased sizes of the cut-out portions 52 will accommodate the volume of paste that eventually fills the thermal vias 18.

The invention has been described with reference to a preferred embodiment. However, it will be appreciated that variations and modifications can be effected by a person of ordinary skill in the art without departing from the scope of the invention.

PARTS LIST

10 electrical component
12, 14 mating portion of 10
16 heat-removing element
18 thermal vias
20 high density copper plane
22 webs of heat-removing element 16
25 collection of signals
30 electrical assemblage
32 circuit board
34 heat-generating component
35 inner layers of circuit board 32
37 top outer layer of circuit board 32
38 bottom outer layer of circuit board 32
39 adhesive layer
40 heat sink 50 solder stencil
52 cut-out portion of solder stencil 50

What is claimed is:

1. A method of cooling components arranged on a circuit board, comprising the steps of:

providing said circuit board containing at least one component mounted thereon, said at least one component having a characteristic junction temperature $T_j$ and a first and second mating surfaces;

providing means for reducing said junction temperature $T_j$ of said at least one component, said means comprising the step of adapting at least one heat removing element comprising a plurality of thermal vias to said at least one component, said heat removing element being electrically associated with either of said first and second mating surfaces, and said plurality of thermal vias being separated from either of said first and second mating surfaces by a web;

cooperatively associating a heat sink element to said at least one heat removing element for transporting heat removed from said at least one component to said at least one heat removing element, thereby reducing said junction temperature $T_j$ of said at least one component to a temperature $T_1$, wherein $T_1$ is less than $T_j$.

2. The method recited in claim 1 wherein said step of providing means for reducing said juncture temperature $T_j$ includes the step of forming each one of said plurality of thermal vias with a diameter of about 0.022 inches.

3. The method recited in claim 2, wherein said step of forming each one of said plurality of thermal vias further includes the step of spacing a nearest adjacent vias about 0.040 inches apart as measured from a center portion of a first vias to a second center portion of said nearest adjacent vias.

4. The method recited in claim 1 further including providing an aluminum heat sink having a thickness of about 0.090 inches.

5. The method recited in claim 1 wherein said step of cooperatively associating a heat sink element includes the step of bonding said heat sink element to said at least one heat removing element with a silicone based, thermally conductive, electrically isolating adhesive film material.

6. The method recited in claim 5 wherein the step of bonding further includes the step of providing an adhesive film having a 0.007 inch glass bead incorporated therein to facilitate bonding.

7. The method recited in claim 2 wherein after said step of forming each one of said plurality of vias further comprises the step of filling each one of said plurality of vias with a solder material.

* * * * *

UNITED STATES PATENT AND TRADEMARK OFFICE
CERTIFICATE OF CORRECTION

PATENT NO. : 6,671,176 B1
DATED : December 30, 2003
INVENTOR(S) : Tina P. Barcley It is certified that error appears in the above-identified patent and that said Letters Patent is hereby corrected as shown below:

Column 6,
Line 19, delete "0.007" and insert -- .007 --.

Signed and Sealed this

Fifteenth Day of February, 2005

JON W. DUDAS
*Director of the United States Patent and Trademark Office*